(12) United States Patent
Van Den Brink

(10) Patent No.: US 7,157,910 B2
(45) Date of Patent: Jan. 2, 2007

(54) MAGNETIC RESONANCE IMAGING APPARATUS AND METHOD

(75) Inventor: Johan Samuel Van Den Brink, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 27 days.

(21) Appl. No.: 10/518,983

(22) PCT Filed: Jun. 11, 2003

(86) PCT No.: PCT/IB03/02386

§ 371 (c)(1),
(2), (4) Date: Dec. 21, 2004

(87) PCT Pub. No.: WO04/001435

PCT Pub. Date: Dec. 31, 2003

(65) Prior Publication Data
US 2006/0006867 A1 Jan. 12, 2006

(30) Foreign Application Priority Data
Jun. 21, 2002 (EP) .................................. 02077474

(51) Int. Cl.
G01V 3/00 (2006.01)
(52) U.S. Cl. ...................................... 324/318; 324/309
(58) Field of Classification Search ................ 324/318, 324/307, 309
See application file for complete search history.

(56) References Cited

U.S. PATENT DOCUMENTS

| 5,122,749 A | * | 6/1992 | Hashino ....................... 324/309 |
| 5,666,055 A | | 9/1997 | Jones et al. |
| 5,861,749 A | * | 1/1999 | Van Heelsbergen ......... 324/322 |
| 6,597,173 B1 | * | 7/2003 | Bernstein ..................... 324/318 |
| 6,825,660 B1 | * | 11/2004 | Boskamp ..................... 324/318 |
| 6,870,368 B1 | * | 3/2005 | Visser et al. ................. 324/318 |

FOREIGN PATENT DOCUMENTS

EP 0 407 579 A1 1/1991

OTHER PUBLICATIONS

Bankson, et al.; SMASH Imaging with an Eight Element Multiplexed RF Coil Array; 2000; MR Mat. in Physics; 10: 93-104.
Pruessmann, et al.; SENSE: Sensitivity Encoding for Fast MRI; 1999; MRM; 42:952-962.

* cited by examiner

Primary Examiner—Louis M. Arana
(74) Attorney, Agent, or Firm—Thomas M. Lundin

(57) ABSTRACT

A magnetic resonance imaging apparatus includes an RF coil system with M RF coils (11–18) for detecting RF signals from a region of interest, M being an integer larger than 2, and N receiver channels (C1–C4) for receiving and processing the detected RF signals, N being an integer larger than 1 and smaller than M. At least two RF coils (12, 16; 14, 18) are combined for reception of RF signals of said RF coils with a single receiver channel. The at least two RF coils are selected so as to provide maximum spatially varying coil sensitivities along the principal axis for coil sensitivity encoding. The proposed MRI apparatus provides an optimal solution enabling it to be used with the SENSE method. The individuality is maximized along the preferred or actual sense reduction direction as is spatial distinctness along the axes of primary clinical interest.

14 Claims, 4 Drawing Sheets

MAGNETIC RESONANCE IMAGING APPARATUS AND METHOD

BACKGROUND

The present invention relates to a magnetic resonance imaging (MRI) apparatus comprising an RF coil system comprising M RF coils for detecting RF signals from a region of interest, M being an integer larger than 2, and N receiver channels for receiving and processing the detected RF signals, N being an integer larger than 1 and smaller than M.

The invention also relates to a magnetic resonance imaging (MRI) method comprising the steps of detecting RF signals from a region of interest using an RF coil system comprising M RF coils, M being an integer larger than 2, and receiving and processing the detected RF signals using N receiver channels, N being an integer larger than 1 and smaller than M.

An MRI apparatus and an MRI method of the kinds mentioned in the opening paragraphs are generally known and widely used. A magnet is used for generating a temporarily constant, uniform magnetic field through an examination region, and a radio frequency (RF) unit comprising an RF coil system is used for transmitting RF signals into the examination region to induce and manipulate magnetic resonance of dipoles disposed in the examination region and/or for receiving RF signals from the dipoles disposed in the examination region.

The article "SENSE: Sensitivity Encoding For Fast MRI", klaas P. Pruessmann et al., Magnetic Resonance In Medicine 42:952-962 (1999) describes a concept for considerably enhancing the performance of magnetic resonance imaging by means of arrays of multiple receiver coils. In said article sensitivity encoding (SENSE) is described, which is based on the fact that receiver sensitivity generally has an encoding effect complementary to Fourier preparation by linear field gradients. By making use of an array of multiple receiver coils, scan time can be reduced and resolution can be increased. The method described takes advantage of undersampling or reduction of k-space samples and known individual coil sensitivity profiles. Since sampling is performed with a step size larger than that prescribed by the Nyquist theorem, the so-called foldover occurs during the (always necessary) Fourier transformation, so that in principle two different points from the physical image space cannot be distinguished from one another.

In practice, the anatomical region to be examined requires more coil elements and receiver channels that are provided as hardware in the MRI apparatus. An MRI apparatus produced and sold by Philips, the Gyroscan NT which is also used in practice, can handle up to six synergy/phased array coils simultaneously by using six receiver channels. But certain applications could require more receiver channels and RF coils. If there are more RF coils than receiver channels it is necessary to select coils for allocation to the available receiver channels. A larger number of receiver channels is possible in principle and would lead to shorter acquisition times or higher resolutions. But each additional receiver channel increases the costs of an MRI apparatus considerably, and each change in the number of receiver channels necessitates a redesign of the entire system because more bandwidth is required then.

It is common in the art for an RF coil system having e.g. eight RF coils to map these onto four receiver channels by combining RF signals from opposite RF coils in quadrature mode. However, such a combination is not optimal for the above mentioned SENSE method as points in space that have to be unfolded when applying the SENSE reduction are encoded equally in a single receiver channel.

SUMMARY

It is an object of the present invention to provide a magnetic resonance imaging (MRI) apparatus and a magnetic resonance imaging (MRI) method of the kinds mentioned in the opening paragraphs which are optimized for the SENSE method and which allow a cheap, robust and reliable support for the MRI apparatus, having fewer receiver channels than elements in the RF coil system.

In order to achieve this object a magnetic resonance imaging apparatus and a magnetic resonance imaging method are characterized in that at least two RF coils are combined for reception of RF signals of said RF coils with a single receiver channel, wherein said at least two RF coils are selected so as to provide maximum spatially varying coil sensitivities along the principal axis for coil sensitivity encoding.

The combination of RF signals from RF coils is selected by using the knowledge of the preferred orientation of scanning and/or SENSE reduction direction. The SENSE method uses the spatial distinctness of the coil sensitivity profiles to encode for spatial information. Data from several points in space will coincide in the under-encoded image. To facilitate SENSE unfolding the sensitivities at the points to which the data has to be unfolded should be as distinct as possible. This is best achieved when the individual RF coils or coil-combinations probe the examination object, e.g. a patient or a part of a patient, in a way that is as different as possible. Preferably, a fixed combination is selected to downscale the number of RF coils M to the number of receiver channels N based upon insights regarding anatomy and preferred imaging planes/orientations and related foldover/SENSE folding directions; i.e. a combination is preferably selected in dependence on the preferred coil sensitivity encoding axis for the majority of examinations to be performed with the RF coil system.

A particular embodiment of a magnetic resonance imaging apparatus according to the invention is characterized in that pairs of two RF coils are each combined and connected to a separate receiver channel, wherein at least one RF coil is not combined with any other RF coil. It has been shown in practice that such an embodiment, where one or more RF coils remain individual so that the RF signals received from said coils are not combined with RF signals from one or more other RF coils into a common receiver channel results in a better signal-to-noise ratio (SNR).

A particular embodiment of a magnetic resonance imaging apparatus according to the invention is characterized in that the RF coil system comprises 8 RF coils and the MRI apparatus comprises 6 receiver channels, wherein two pairs of two RF coils are each combined with two receiver channels, while the four remaining RF coils are connected to the four remaining receiver channels. Such an RF coil system is preferably applied for scanning the head of a patient, the 8 RF coils being preferably arranged around the head in the form of a bird cage. Another application is cardiac imaging where two rings of four RF coils are each arranged around the body of a patient. Advantageous embodiments of such MRI apparatuses will be explained in more detail with reference to the Figures below. However, the invention is not restricted to these particular embodiments but can be applied to any other MRI apparatus comprising more RF coils than receiver channels.

Advantages of the present application will be apparent to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION

Figure 1:
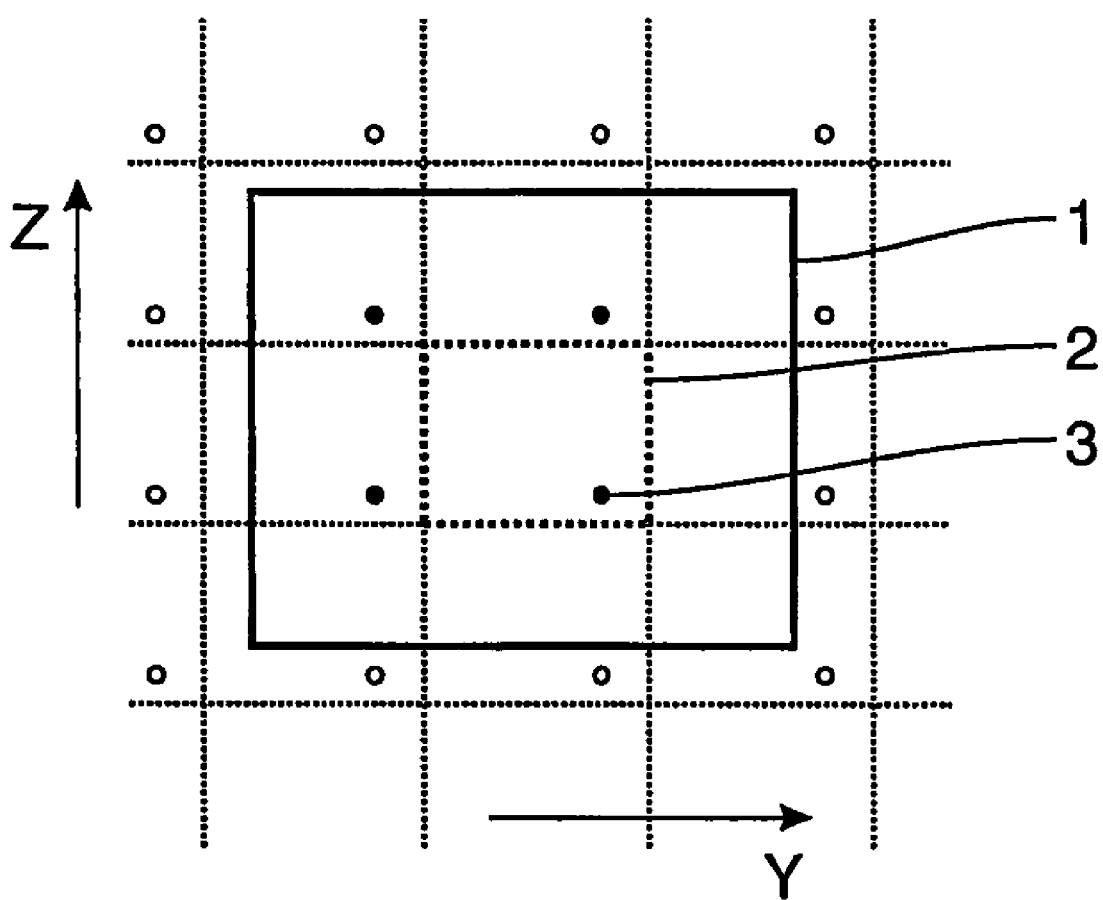
FIG. 1 shows a diagram explaining the SENSE method in general.

FIG. 1 shows a diagram explaining several terms used for describing the invention. Therein a two-dimensional cartesian grid is shown which grid is arranged in the z- y-direction. The z-direction can be regarded as the slice selection direction, and the y-direction can be regarded as the phase encoding direction. The known method makes use of sensitivity encoding and takes advantage of under sampling or reduction of k-space samples and known individual coil sensitivity profiles. The field of view (FOV) 1 is thus reduced in both dimensions. A pixel 3 in the reduced FOV 2 represents the superposition of pixels forming a cartesian grid. In the example shown in FIG. 1 four of these pixels are in the full FOV 1. Thus the actual degree of aliasing is four. Aliased pixels are created thereby in the individual coil restructured images, which can, however, be unfolded by making use of the different sensitivity profiles of each coil. There are a few constraints on this. Reduction of k-space samples using SENSE and subsequent effective unfolding of the image can only be achieved in the direction of multiple receiver coils, i.e. in the reduction direction. The SENSE reconstruction algorithm will unfold the image. Aliasing or foldover artefacts are thus created in the same direction, i.e. in the foldover direction.

Figure 2:
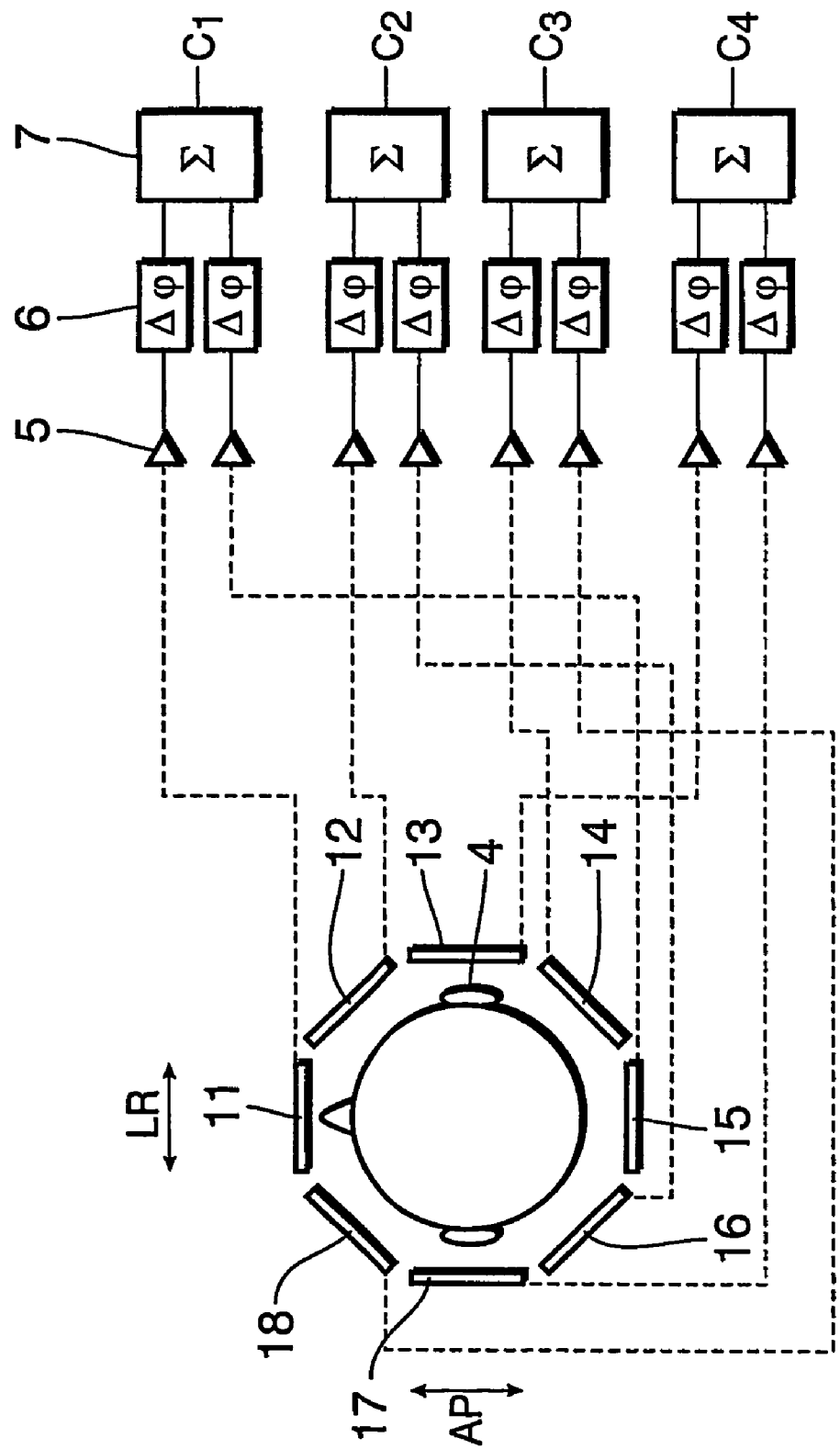
FIG. 2 shows an embodiment of a known head coil arrangement.

FIG. 2 shows an embodiment of a known RF coil system comprising 8 RF coils 11–18, which are arranged around the head 4 of a patient in the form of a bird cage, and additional known means for selecting and combining the RF signals from these 8 RF coils 11–18 into four receiver channels $C_1$, $C2$, $C3$, $C4$. As can be seen the RF signals from each individual RF coil 11–18 are first preamplified by a preamplifier 5, then phase shifted by a phase shifter 6 before the RF signals of pairs of two RF coils are combined by an RF adder/combiner 7 into a single receiver channel. According to the known proposal the RF signals of RF coils arranged on opposite sides of the head 4 are combined into one receiver channel, i.e. RF signals from RF coils 11 and 15 are combined into receiver channel C1, RF signals from RF coils 12 and 16 are combined into receiver channel C2, RF signals from RF coils 13 and 17 are combined into receiver channel C4 and RF signals from RF coils 14 and 18 are combined into receiver channel C3. This results in one set of LR (=left/right) coils 11, 15, one set of AP (=anterior/posterior) coils 13, 17 and two sets of coils 12, 16 and 14, 18 being arranged obliquely to the AP and LR direction.

The RF coil system shown in FIG. 2 is not optimal for the SENSE method since points in space that have to be unfolded when applying the SENSE reduction are encoded in a single receiver channel that does not sufficiently adequately show different complex coil sensitivity patterns to enable unfolding. It is therefore proposed, according to the present invention, to combine the RF signals from RF coils in such a way that maximum spatially varying coil sensitivities are provided along the principle axes for coil sensitivity encoding. This means that a fixed combination of RF signals from RF coils is chosen according to the insight into or knowledge of the preferred main orientation of scanning and SENSE reduction direction in the anatomy of primary interest. As much individuality as possible should be provided along the preferred or actual SENSE reduction direction. Exemplary embodiments of such combinations are schematically illustrated in FIGS. 3 to 6.

The embodiments are discussed using the anatomy of the brain. Here, at least in cylindrical systems, the majority of scans employ a foldover direction LR (approximately 70%), followed by AP (approximately 20%, especially EPI). Given the strong preference for certain directions, a "hard-wired" choice can be made for combining 4 out of 8 coils into 2 channels.

Figure 3:
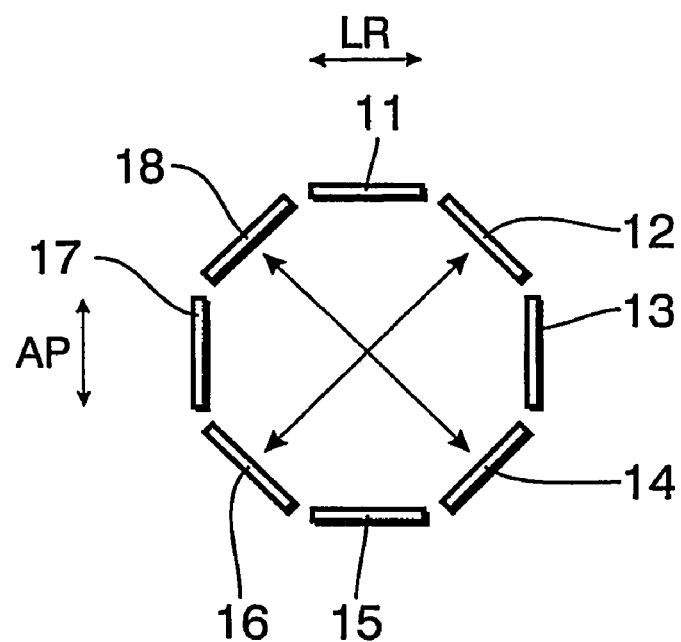
FIG. 3 schematically shows a first embodiment of an RF coil system according to the invention, FIG. 4 schematically shows a second embodiment of an RF coil system according to the invention, FIG. 5 schematically shows a third embodiment of an RF coil system according to the invention, and FIG. 6 schematically shows a fourth embodiment of an RF coil system according to the invention.

FIG. 3 shows a first embodiment of a combination of RF signals from RF coils for an RF coil system comprising 8 RF coils 11–18. For all these embodiments it is assumed that 6 receiver channels are available, but the generalization to more or fewer RF coils and/or receiver channels can easily be made by those skilled in the art. To map the RF signals of the 8 RF coils 11–18 onto these 6 receiver channels, two pairs of two RF coils are formed, the RF signals of which are each combined into a single receiver channel, while the RF signals of the remaining four RF coils are each inputted into a separate single receiver channel.

According to the first embodiment shown in FIG. 3, the RF signals of RF coils 12 and 16 are combined into one receiver channel, and the RF signals of RF coils 14 and 18 are combined into one receiver channel. The remaining RF coils remain individually and are separately connected to the four remaining receiver channels. In this embodiment the RF signals of RF coils, which are arranged obliquely to the anterior/posterior (AP) and left/right (LR) axes, are combined, while the RF signals of RF coils 11, 13, 15, 17, which are arranged parallel or orthogonally to said directions, remain individual.

Figure 4:
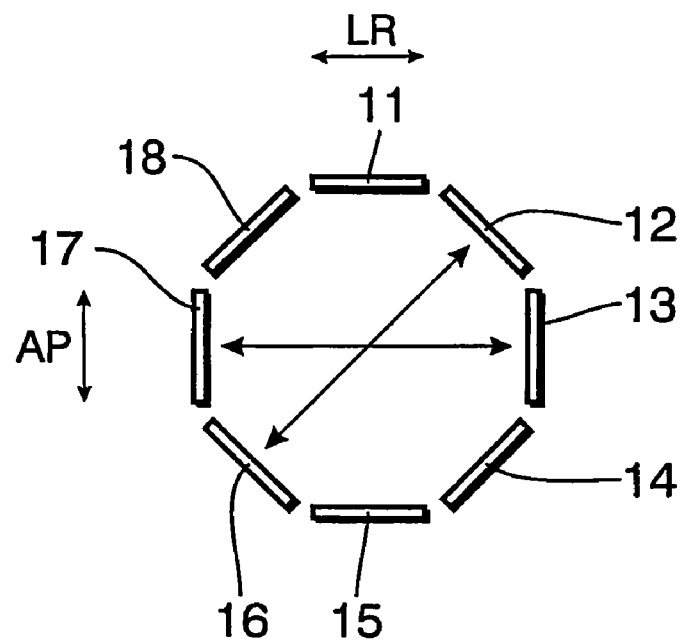

In the second embodiment shown in FIG. 4 the RF signals of RF coils 12 and 16, and the RF signals of RF coils 14 and 18 are combined into separate receiver channels. Such an asymmetric combination would be preferred if, for instance, the AP direction is selected as SENSE reduction direction. In this case such a combination would be advantageous when considering phase behaviour. As can be seen, the RF coils 13 and 17 of the first pair are arranged parallel to the SENSE reduction direction, while the RF coils 12 and 16 of the second pair are arranged obliquely to the SENSE reduction direction, but are located next to the coils 17 and 13 of the first pair.

Figure 5:
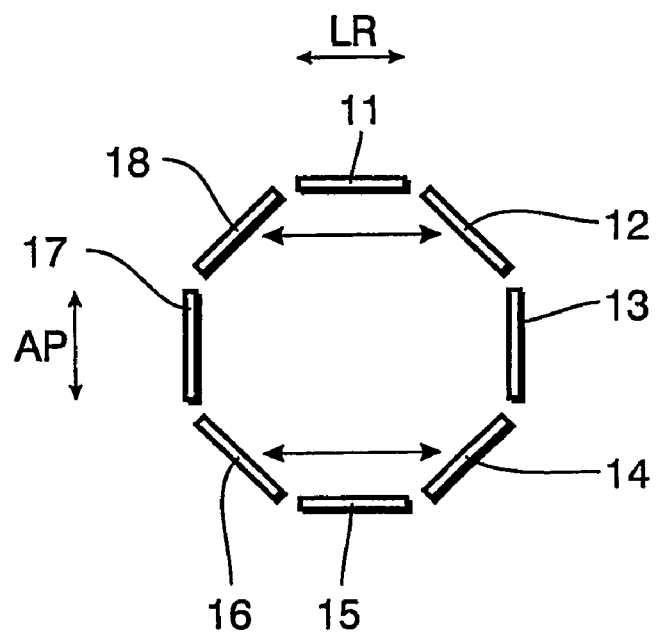

A more symmetric combination is shown in FIG. 5. Therein RF signals of RF coils 12 and 18 are combined and RF signals of RF coils 14 and 16 are combined into a separate receiver channel. When selecting the AP direction as SENSE reduction direction, also in this case the arrangement of the RF coils 12, 14, 16 and 18, the RF signals of which are combined in pairs, are arranged obliquely to the SENSE reduction direction. However, contrary to the embodiment shown in FIG. 3, one RF coil of each pair is parallel to one RF coil of the other pair.

Figure 6:
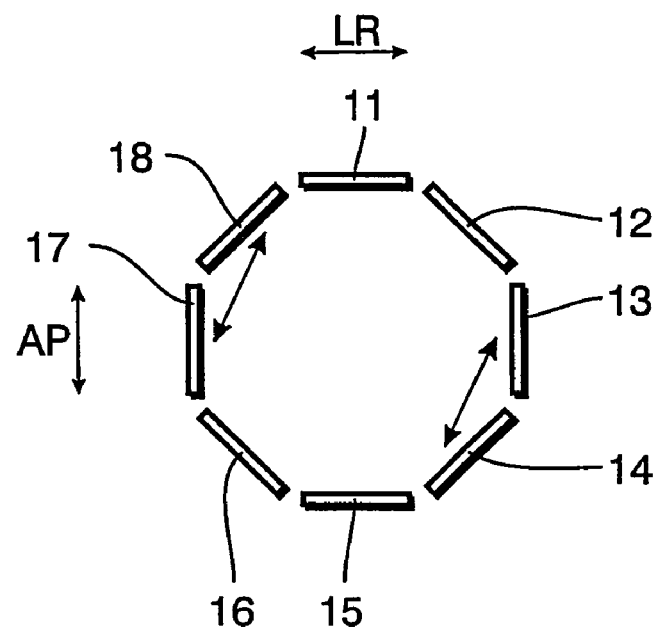

A fourth embodiment is schematically shown in FIG. 6. Therein RF signals of RF coils 13 and 14 are combined and RF signals of RF coils 17 and 18 are combined into a separate single receiver channel. It has been shown in practice that such a combination of adjacent RF coils, particularly with a 90° phase shift, leads to a high SNR.

It is noted that the embodiments of an MRI apparatus comprising an RF coil system having 8 RF coils as shown and described above shall be understood as particular examples which do not restrict the invention to such a particular RF coil system. In contrast, the invention is applicable to any MRI apparatus comprising an RF coil system where the number of RF coils is higher than the number of receiver channels. Furthermore, the combination of coils can also differ from the combinations shown and described above. In general the individual coil array elements shall be aligned as much as possible along the principle SENSE reduction direction for the main anatomy of interest.

In a head coil arrangement, where the imaging plane is often tilted some 20° relative to the LR axis, the RF coils covering the AP direction shall be in line with this orientation. In applications like cardiac imaging the individual RF coils should optimally cover the most common slice positions in the heart, like short axis, long axis, four chamber views and their respective foldover or SENSE reduction direction. It can be envisaged that the optimally positioned RF coils are automatically moved and selected to optimize the geometry factor. This depends on the starting point of the geometry of the individual RF coils. Provided the RF coil system comprises two rings of four RF coils to be combined with 6 receiver channels, the RF coils at the right anterior and/or posterior parts of the body are expected not to contribute much to the required sensitivity for a long axis view. These can, for example, be combined. However, this needs some additional investigation depending on the size of the RF coils and their topology. In general the RF coils are combined for reasons of, for example, legacy support of older MR systems having fewer receiver channels than the number of RF coil elements, in such a way that the remaining combined RF coils do feature as much spatial distinctness as possible along the axes of primary clinical interest.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A magnetic resonance imaging apparatus comprising:
an RF coil system comprising M RF coils for detecting coil sensitivity encoded RF signals from a region of interest, M being an integer larger than 2, the RF coils being disposed circumferentially around the region of interest; and
N receiver channels for receiving and processing the detected RF signals, N being an integer larger than 1 and smaller than M, wherein at least two RF coils are combined for reception of RF signals of said RF coils with a single receiver channel, wherein said at least two RF coils are selected so as to provide maximum spatially varying coil sensitivities along the principal axis for coil sensitivity encoding.

2. A magnetic resonance imaging apparatus comprising:
an RF coil system comprising M RF coils for detecting RF signals from a region of interest, M being an integer larger than 2; and
N receiver channels for receiving and processing the detected RF signals, N being an integer larger than 1 and smaller than M, wherein at least two RF coils are combined for reception of RF signals of said RF coils with a single receiver channel, wherein said at least two RF coils are selected so as to provide maximum spatially varying coil sensitivities along the principal axis for coil sensitivity encoding wherein pairs of two RF coils are each combined and connected to a separate receiver channel, wherein at least one RF coil is not combined with any other RF coil.

3. A magnetic resonance imaging apparatus as claimed in claim 2, wherein said RF coil system comprises 8 RF coils, wherein 6 receiver channels are provided and wherein pairs of two RF coils are each combined for reception of RF signals of said pairs of RF coils with two separate receiver channels, respectively.

4. A magnetic resonance imaging apparatus as claimed in claim 3, wherein said 8 RF coils are arranged in the shape of a ring.

5. A magnetic resonance imaging apparatus as claimed in claim 2, wherein said pairs of two RF coils, which are each combined, are arranged obliquely to the principal axes for sensitivity encoding.

6. A magnetic resonance imaging apparatus as claimed in claim 5, wherein the RF coils of a first pair are arranged parallel to each other and the RF coils of a second pair are arranged parallel to each other and orthogonally to the RF coils of the first pair.

7. A magnetic resonance imaging apparatus as claimed in claim 2, wherein the RF coils of a first pair are arranged orthogonally to each other and the RF coils of a second pair are arranged orthogonally to each other, wherein each of said RF coils of the second pair is arranged parallel to one RF coil of the first pair.

8. A magnetic resonance imaging apparatus as claimed in claim 2, wherein the RF coils of a first pair are arranged parallel to the principal axis for sensitivity encoding and the RF coils of a second pair are arranged obliquely to the principal axis for sensitivity encoding.

9. A magnetic resonance imaging apparatus as claimed in claim 8, wherein the RF coils of said first or said second pair, respectively, are juxtaposed.

10. A magnetic resonance imaging apparatus as claimed in claim 8, wherein the RF coils of said first or said second pair, respectively, are parallel to each other.

11. A magnetic resonance imaging apparatus as claimed in claim 2 wherein the M RF coils are mounted in a birdeage coil arrangement.

12. A magnetic resonance imaging apparatus as claimed in claim 2 wherein said pairs of RF coils which are combined are arranged obliquely to the anterior-posterior axis and the left-right axis.

13. A magnetic resonance imaging method comprising the steps of:

detecting RF signals from a region of interest using an RF coil system comprising M RF coils, M being an integer larger than 2; and receiving and processing the detected RF signals using N receiver channels, N being an integer larger than 1 and smaller than M; at least two RF coils being combined for reception of RF signals of said RF coils and connected with a single one of the receiver channels, at least one other of the RF coils is not combined with an other RF coil and is connected with another one of the receiver channels.

14. A magnetic resonance imaging method as claimed in claim 13 wherein said at least two RF coils are selected so as to provide maximum spatially varying coil sensitivities along the principal axis for coil sensitivity encoding.

* * * * *